(12) United States Patent
Uemura

(10) Patent No.: US 6,242,957 B1
(45) Date of Patent: Jun. 5, 2001

(54) MASTER-SLAVE TYPE FLIP-FLOP

(75) Inventor: Hideaki Uemura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/315,595

(22) Filed: May 20, 1999

(30) Foreign Application Priority Data

May 21, 1998  (JP) .................................................. 10-140224

(51) Int. Cl.[7] .................................................. H03K 3/356
(52) U.S. Cl. .......................................... 327/202; 327/203
(58) Field of Search ..................................... 327/202, 203, 327/208, 209, 210, 211, 212, 218, 200, 201

(56) References Cited

U.S. PATENT DOCUMENTS 6,008,678 * 12/1999 Barber .................................. 327/203

FOREIGN PATENT DOCUMENTS

| 363214017 | * 9/1988 | (JP) | 327/203 |
|---|---|---|---|
| 403001608 | 1/1991 | (JP) | 327/202 |
| 403277010 | * 12/1991 | (JP) | 327/203 |
| 405327435 | * 12/1993 | (JP) | 327/202 |

* cited by examiner

Primary Examiner—Tuan T. Lam
(74) Attorney, Agent, or Firm—Darryl G. Walker

(57) ABSTRACT

According to one embodiment, a master-slave flip-flip circuit (MS-FF) (100) includes master input transfer gate (108) connected to the input of a master latch portion (102) and a slave input transfer gate (110) connected to the input of a slave latch portion (104). A clock generating circuit (112) includes a first inverter (114-0) that provides an inverted clock signal CB1 and a second inverter (114-1) that provides a non-inverted clock signal C1. The clock signals C1 and CB1 are provided to the slave input transfer gate (104). The clock signals C1 and CB1 are further provided to the master input transfer gate (108) through clock lines (116-0) and (116-1) which have a parasitic resistances R1 and R2. The parasitic resistances R1 and R2 delay the C1 and CB1 signals and thereby provides a delayed inverted clock signal CB2 and a delayed non-inverted clock signal C2 to the master input transfer gate (108). By utilizing a clock generating circuit formed out of two inverters (114-0) and (114-1), the area of the MS-FF (100) can be reduced, and a smaller sized MS-FF circuit can be realized.

20 Claims, 2 Drawing Sheets

MASTER-SLAVE TYPE FLIP-FLOP

TECHNICAL FIELD

The present invention relates generally to flip-flop logic circuits, and more particularly to master-slave type flip-flops.

BACKGROUND OF THE INVENTION

Master-slave flip-flop circuits (MS-FFs) are known in the art. A conventional MS-FF typically includes a master latch and a slave latch connected in series with one another. A data signal (D) can be applied at a data input, and the master latch can read in and latch the data synchronously with an applied clock signal. After the master latch has operated (i.e., latched the data), the slave latch can latch a value output from the master latch. The output of the slave latch is provided as an output signal Q.

To accomplish their respective latching operations, a master latch and slave latch can be provided with a input transfer gates that function in response to certain clock signals. One way to generate clock signals is to apply a clock signal to a first inverter circuit to generate an inverted clock signal. The inverted clock signal can then be applied to a second inverter to generate a non-inverted clock signal. The inverted and non-inverted clock signals can be used to activate the transfer gates within the MS-FF and thereby allow values to be latched in the master and slave latches.

Ideally, a MS-FF operates by a master latch storing a logic value and the slave latch providing a logic value. The logic value in the master and slave latches may be the same or may be different according to the timing of clock signals. Values in the master latch can be changed by applying a new logic value to the master latch, and then clocking the new value into the master latch. The master latch will then store a new value, while the slave latch, ideally, continues to provide its logic value as an output. Subsequently, the master latch value can be clocked into the slave latch.

One way to accomplished the above clocking operation is provide a master input transfer gate at the input of the master latch, and a slave input transfer gate at the input of the slave latch. The master input transfer gate can be activated in response to a non-inverted clock signal while the slave input transfer gate can be activated in response to an inverted clock signal, or vice versa.

A drawback to the arrangement described above can arise out of delays introduced by the inverter used to generate the inverted and non-inverted clock signals. Due to such delays, the slave input transfer gate may not be sufficiently turned off prior to the master input transfer gate being turned on. Consequently, a data value applied at the input to the master latch can flow through the master latch to the slave latch. In the event the newly applied data value differs from the previous value latched by the master latch, the "through phenomenon" of the newly applied data value can result in an erroneous logic value being latched in the slave latch.

One approach to preventing the through phenomenon in a MS-FF is to generate clock signals that clock in data from a master latch to a slave latch at an earlier point of time than new data is clocked into the master latch. Such an approach is described in Japanese laid-open publication Kokkai Hei 3-1608. In this technique, even if newly applied data passes through the master latch, the slave input transfer gate will already be sufficiently turned off, and the slave latch will not accept the newly applied data. Hence, an erroneous operation as described above can be prevented.

The approach described by Japanese laid-open publication Kokkai Hei 3-1608 utilizes a first set of inverted and non-inverted clock signals that are applied to a transfer gate at the input of a slave latch. In addition, third and fourth inverter circuits are provided that generate a second set of inverted and non-inverted clock signals. The second set of inverted and non-inverted clock signals is supplied to a transfer gate at the input of a master latch. The delay introduced by the third and fourth inverter circuits makes it possible to safely store data in the slave latch before new data is stored in the master latch.

One drawback to the approach above is that in order to obtain a delay between pairs of clock signals, additional inverter circuits (the third and fourth inverter circuits) are used. The addition of the inverter circuits can result in additional area for the overall MS-FF circuit, as the circuit elements (e.g., transistors) that may be used to form the inverters are typically created in the substrate of an integrated circuit. While it is possible to utilize only one inverter circuit (e.g., only a third inverter circuit) to generate the desired clock signals, such an arrangement can still result in additional area for the MS-FF. Because smaller sized integrated circuits continues to be an on-going goal, small sized MS-FFs are desirable.

In addition to having larger area requirements, conventional MS-FFs that include delayed clock signals may still have drawbacks at higher frequencies due to parasitic resistance within the circuit. Parasitic resistance is the resistance inherent in the physical structures included in a MS-FF. As just a few examples, conductive lines, contact structures, and active devices can introduce parasitic resistance. Conductive lines can include those patterned over a substrate as well as portions of a substrate, such as "underpasses." Contact structures can include contacts that extend from a conductive layer to a substrate, or "vias" that connect two conductive layers. Active devices, such as the source-drain path of a field effect transistor, or collector-emitter path of a bipolar transistor, can also include a parasitic resistance when the transistor is turned on.

Even in a case where a MS-FF has been designed to delay the timing of clock signals by a particular delay time, the operation of transfer gates may result in timing errors due to parasitic resistance. A master input transfer gate may require a relatively long setting time to input new data into a master latch. In addition, a slave input transfer gate may also require a relatively long setting time to input master latch data into a slave latch. Thus, it can be difficult to realize a stable operation at a high frequency.

It would be desirable to provide a MS-FF that avoids the use of additional inverter circuits and can provide stable operation for the latches within the MS-FF. It would also be desirable to provide a MS-FF that can operate at higher frequencies.

SUMMARY OF THE INVENTION

The present invention includes a master-slave flip-flop (MS-FF) having a master input transfer gate coupled to the input of a master latch and a slave input transfer gate coupled to the input of a slave latch. Also included is a clock generating circuit that provides a clock signal to the master input transfer gate and a slave input transfer gate. The clock signal is coupled to the master input transfer gate by a clock line having a parasitic resistance.

According to one embodiment, a clock generating circuit receives a clock signal as a non-inverted clock signal and includes a first inverter that generates an inverted clock signal. The non-inverted and inverted clock signals are provided to a slave input transfer gate. The non-inverted and inverted clock signals are further provided to a master input transfer gate with clock lines that include a parasitic resistance.

According to another embodiment, a clock supply circuit includes a first inverter that generates an inverted clock signal and a second inverter that generates a non-inverted clock signal. The non-inverted and inverted clock signals are provided to a slave input transfer gate. The non-inverted and inverted clock signals are further provided to a master input transfer gate with clock lines that include a parasitic resistance.

According to the embodiments, when a clock signal is input to a MS-FF, a slave input transfer gate can be turned off or on earlier, and a master input transfer gate can be turned off or on later, due to a delay introduced by parasitic resistance in clock signal lines. In this way, data can be latched in a slave latch earlier than data is latched in a master latch, and the "through phenomenon" can be prevented.

Another aspect of the embodiments is that a MS-FF is provided that can shorten the time between a transition in clock signal and the output of a value from the MS-FF. Further, the setting time required to input a newly applied data value can also be shortened. This can it possible for the MS-FF to operate at a relatively high frequency.

According to another aspect of the embodiments, a clock supply circuit of a MS-FF can include two inverter circuits, or alternatively one inverter circuit, allowing for a MS-FF having a reduced area.

DETAILED DESCRIPTION OF THE EMBODIMENTS

Figure 1:
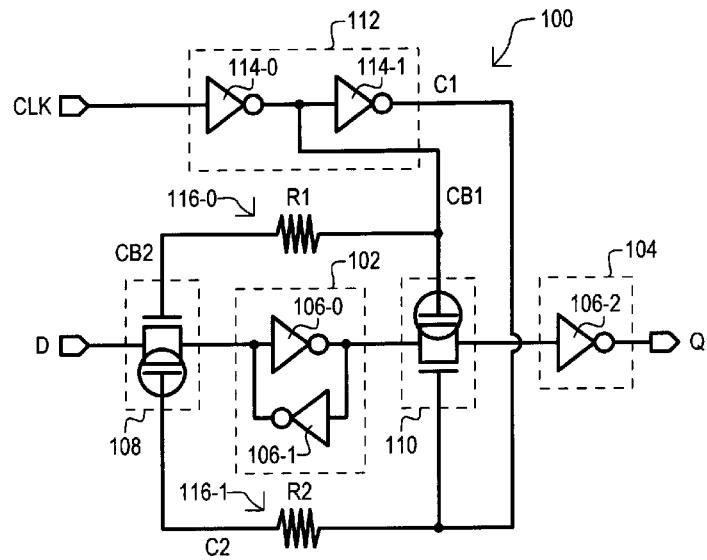
FIG. 1 is a circuit diagram of a first embodiment.

Various embodiments will now be described with reference to a number of figures. FIG. 1 is a circuit diagram of a first embodiment. The first embodiment is a master-slave flip-flop, and is designated by the general reference character 100. The MS-FF 100 is shown to include a master latch portion 102 and a slave latch portion 104. The master latch portion 102 includes inverters 106-0 and 106-1. The input and output of inverter 106-0 are connected to the output and input of inverter 106-1. The slave latch portion 104 is shown to include an inverter 106-2. The master latch portion 102 and slave latch portion 104 are arranged in series with one another. It is noted that while the slave latch portion 104 is shown to include an inverter, such a structure could be subject to variation. As just one example, another inverter could be cross-coupled with inverter 106-2.

Also set forth in FIG. 1 is a master input transfer gate 108 connected to an input of the master latch portion 102. A slave input transfer gate 110 is connected between an output of the master latch portion 102 and an input of the slave latch portion 104. The master and slave input transfer gates (108 and 110) are shown to each include an n-channel insulated gate field effect transistor (IGFET) and a p-channel IGFET having source-drain paths arranged in series. The master and slave input transfer gates (108 and 110) can thus be turned on or turned off by complementary signal values applied at the gates of their respective IGFETs.

The MS-FF 100 of FIG. 1 can receive an input value "D" at the master input transfer ate 108 and can provide an output value "Q" at the slave latch portion 104.

The first embodiment 100 further includes a clock generating circuit 112. The particular clock generating circuit 112 of FIG. 1 is shown to include inverters 114-0 and 114-1. Inverter 114-0 receives a clock signal CLK as an input and provides an inverted clock signal CB1 as an output. Inverter 114-1 receives the inverted clock signal CB1 as an input, and provides a non-inverted clock signal C1 as an output.

The inverted clock signal CB1 is connected to the gate of the p-channel IGFET in slave input transfer gate 110 while the non-inverted clock signal C1 is connected to the gate of the n-channel IGFET in slave input transfer gate 110.

In the arrangement of FIG. 1, a clock line 116-0 connects the gate of the p-channel IGFET within the slave input transfer gate 110 to the gate of the n-channel IGFET within the master input transfer gate 108. In a similar fashion, a clock line 116-1 connects the gate of the n-channel IGFET within the slave input transfer gate 110 to the gate of the p-channel IGFET within the master input transfer gate 108. The clock lines (116-0 and 116-1) each include a resistance, shown as R1 and R2, respectively. In the first embodiment 100, the resistances R1 and R2 are parasitic, and can be created by wiring material made of the same material, and generally of the same length. Such an arrangement can result in signal lines (116-0 and 116-1) of generally equal resistance between the slave input transfer gate 110 and the master input transfer gate 108.

Accordingly, in the first embodiment 100, the inverted clock signal CB1 will be supplied to the gate of the n-channel IGFET of master input transfer gate 108 as a delayed inverted clock signal CB2. The inverted clock signal CB2 being delayed by parasitic resistance R1. The non-inverted clock signal C1 will be supplied to the gate of the p-channel IGFET of master input transfer gate 108 as a delayed non-inverted clock signal C2. The non-inverted clock signal C2 is delayed by parasitic resistance R2.

The parasitic resistance may be formed from structures that include doped or undoped polysilicon, metallization layers, and/or combination metallization layers, to name but a few examples. Further, clock lines that include a parasitic resistance can be formed under the routing channels of other layers. In one particular variation, the length of the lines that carry clock signals to the slave input latch 110 may be shorter than the length of the clock lines (116-0 and 116-1). In addition, the clock lines (116-0 and 116-1) may be narrower than the clock lines that carry clock signals to the slave input latch 110.

Having described the general arrangement of a first embodiment 100, the operation of the first embodiment 100 will now be described in conjunction with a timing diagram set forth in FIG. 2.

Figure 2:
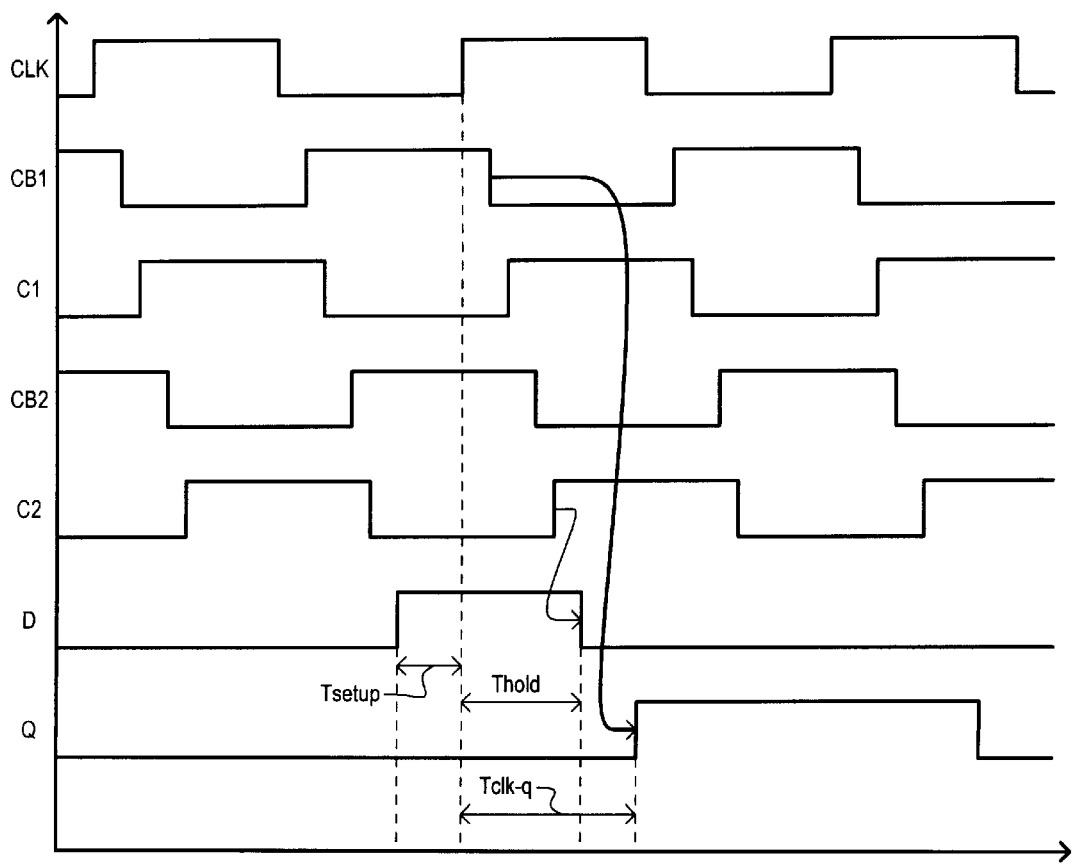
FIG. 2 is a timing diagram illustrating the operation of the circuit of FIG. 1.

FIG. 2 includes the response of a clock signal CLK that can be applied to clock generating circuit 112. Also set forth are representations of the inverted clock signal CB1, non-inverted clock signal C1, delayed inverted clock signal CB2, and delayed non-inverted clock signal C2. In addition, FIG. 2 sets forth the application of an input data value D and the corresponding slave latch output Q. The particular CLK signal response is periodic in FIG. 2.

It is understood that the response of FIG. 2 represents but one circuit response and should not be construed as limiting the invention to particular delay periods, or relationships between delay periods.

The CLK signal is inverted by inverter 114-0 to generate the CB1 signal. The CB1 signal is received by inverter 114-1 and further inverted to generate the C1 signal. The operation of inverter 114-0 can result in the CB1 signal being slightly delayed with respect to the CLK signal. Further, the operation of inverter 114-1 can be result in the C1 signal being slightly delayed with respect to the CB1 signal. The CB1 and C1 signals are applied to the slave input transfer gate 110.

The CB1 and C1 signals are supplied to the master input transfer gate 108 through clock lines 116-0 and 116-1, resulting in the generation of the CB2 and C2. The parasitic resistance R1 of clock line 116-0 can result in the CB2 signal being slightly delayed with respect to the CB1 signal. Similarly, the parasitic resistance R2 of clock line 116-1 can result in the C2 signal being slightly delayed with respect to the C1 signal. In the first embodiment 100, the delay introduced by a parasitic resistances (such as R1 or R2) are selected be generally equal to the delay introduced by an inverter in the clock generation circuit 112 (such as 114-0 or 114-1).

In the first embodiment 100, when a CLK signal is applied, the slave input transfer gate 110 will be turned on by clock signals CB1 and C1 earlier than the master input transfer gate 108, due to the delay introduced by parasitic resistances R1 and R2. In this arrangement, a new input value D can be input to, and pass through, the master latch portion 102 to the slave latch portion 104. However, when the applied D value reaches the slave latch portion 104, the slave latch portion 104 will have already completed its latching operation (i.e., the slave input transfer gate 110 is turned off), and the newly applied D value can be prevented from being erroneously entered into the slave latch portion 104. In this way, the through phenomenon of other conventional approaches can be prevented.

Also set forth in FIG. 2 are various time periods, including a Tclk-q period, Tsetup period and Thold period. The Tclk-q period illustrates the time between an active (low-to-high) transition in the CLK signal and the time an output value Q is provided. The Tsetup period illustrates the time between a transition in an input value D and an active transition in the CLK signal. The Thold period illustrates the time the input value is to be maintained following an active transition in the CLK signal.

The first embodiment 100 can result in shorter Tclk-q time periods and/or shorter Tsetup periods, allowing the MS-FF 100 to operate at a higher frequency.

Additionally, or alternatively, the first embodiment 100 can include a clock generating circuit 112 that includes only two inverters (114-0 and 114-1). Thus, a stable MSFF can be provided with reduced area over other conventional approaches that include three or four inverters in a clock generating circuit. Smaller MS-FF can thus be realized according to the teachings set forth herein.

It is noted that while other approaches to introducing a resistance such as R1 or R2 are possible, the use of a parasitic resistance formed from an integrated circuit conductive line may be advantageous as it can utilize existing process capabilities. As just one example, an existing clock line connection can be intentionally lengthened by modifying a metallization mask. Furthermore, or in addition to, the resistance may be made programmable by opening fusible links that can connect clock lines arranged in parallel.

Figure 3:
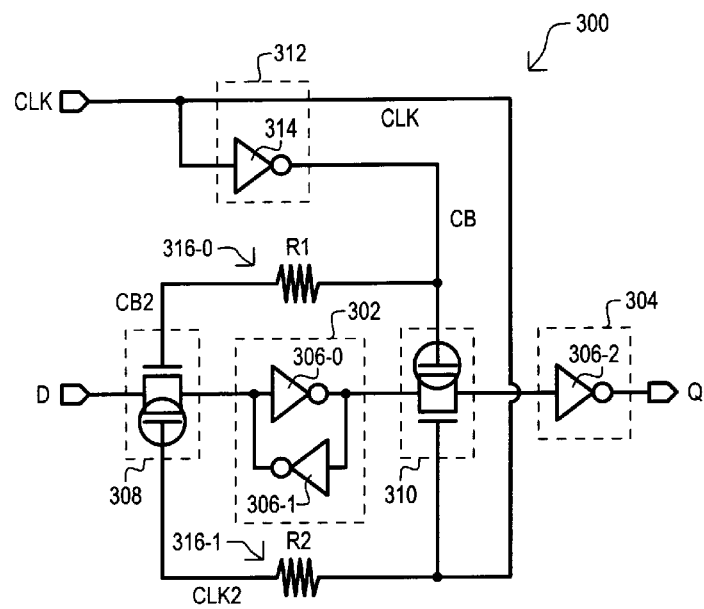
FIG. 3 is a circuit diagram of a second embodiment.

Referring now to FIG. 3, a second embodiment is set forth in a schematic diagram and designated by the general reference character 300. The second embodiment 300 can include many of the same general constituents as the first embodiment 100. To that extent, like constituents will be referred to by the same reference character, but with the first numeral being a "3" instead of a "1."

The second embodiment 300 includes a master latch portion 302 that receives input values by way of a master input transfer gate 308. A slave latch portion 304 receives values output from the master latch portion 302 by way of a slave input transfer gate 310. The master and slave input transfer gates (308 and 310) are controlled by clock signals generated by a clock generating circuit 312. The clock generating circuit 312 of the second embodiment 300 differs from that of the first embodiment 100 in that it can utilize only one inverter 314.

In the second embodiment 300 a clock signal CLK is applied to an n-channel IGFET within the slave input transfer gate 310. The CLK signal is further inverted by inverter 314 to generate an inverted clock signal CB. The CB signal is applied to a p-channel IGFET within the slave input transfer gate 310.

Figure 4:
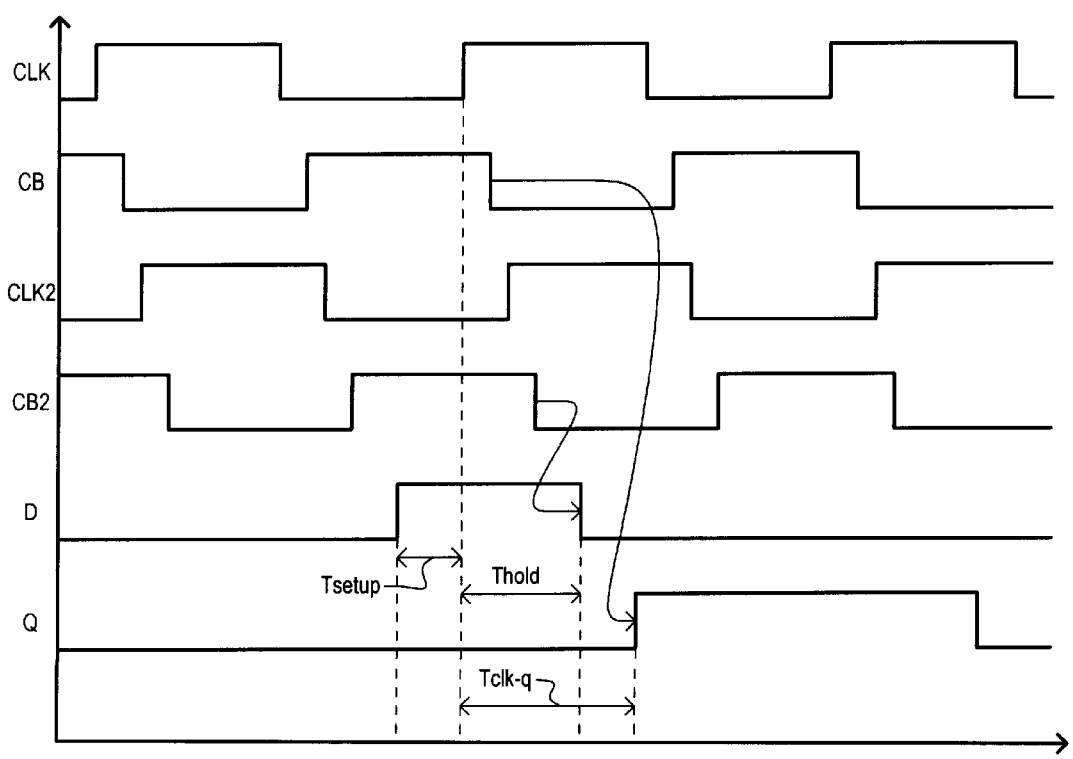
FIG. 4 is a timing diagram illustrating the operation of the circuit of FIG. 3.

A clock line 316-0 connects the gate of the p-channel IGFET within the slave input transfer gate 310 to the gate of an n-channel IGFET within the master input transfer gate 308. Similarly, a clock line 316-1 connects the gate of the n-channel IGFET within the slave input transfer gate 310 to the gate of a p-channel IGFET within the master input transfer gate 308. The clock lines 316-0 and 316-1, as in the case of the first embodiment 100, can each include a resistance, shown as R1 and R2, respectively. The resistances R1 and R2 can also be parasitic, and can be formed in the manner as described above in conjunction with the first embodiment 100. The clock lines (316-0 and 316-1) result in a delayed clock signal CLK2 and delayed inverted clock signal CB2 being applied to the master input transfer gate 308. FIG. 4 is a timing diagram illustrating the operation of the second embodiment 300. Set forth in FIG. 4 are the CLK, CB, CLK2 and CB2 signals described. In addition, an example of an applied input value D and corresponding MS-FF output value Q are also illustrated.

As in the case of FIG. 2, the timing diagram is understood to represent but one particular response.

From the clock signal pairs CLK/CB and CLK2/CB2, the turning on/off of the master and slave input transfer gates (308 and 310) may be understood. It is thus shown that the operation of the second embodiment 300 are generally similar to that of the first embodiment 100. Accordingly, like the first embodiment 100, the second embodiment 200 can prevent the through phenomenon, shorten Tclk-q time periods, and shorten Tsetup time periods. In addition, the second embodiment 300, by employing only one inverter 314 in the clock generating circuit 308, can realize area savings beyond that of the first embodiment 100.

According to the described embodiments, MS-FF circuits are set forth in which clock signals for the input transfer gate of a slave latch portion are supplied to the input transfer gate of a master latch portion through clock signal lines having a parasitic resistance. The input transfer gate of the slave latch portion can thus be turned on/off earlier in time than the input transfer gate of the master latch portion, due to delay introduced by the parasitic resistance. In this arrangement, a slave latch portion can complete a latch operation prior to the master latch portion, preventing a through phenomenon from possibly creating erroneous results.

The teachings of the disclosed embodiments can shorten a clock-to-output data time period (Tclk-q), as well as an input data setup time (Tsetup). This can allow an MS-FF to operate at a faster frequency. Furthermore, MS-FF clock generating circuits according to the embodiments can include one or two inverters, thereby providing for reduced area MS-FF.

It is noted that while the illustrated embodiments set forth MS-FF circuits that are realized with complementary metal-oxide-semiconductor (CMOS) devices, this should not be construed as limiting the invention thereto. Other circuit approaches could be used to clock data signals into a master latch portion and/or slave latch portions. Further, while particular structures are described for providing a more resistive clock line (i.e., parasitic resistance) the invention should not necessarily be construed as being limited thereto.

Accordingly, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A master-slave type flip-flip, comprising:
    a master latch part that includes a master input port;
    a slave latch part that includes a slave input port;
    a master transfer gate coupled to the master input port;
    a slave transfer gate coupled to the slave input port; and
    a clock supply circuit that provides a first clock signal to the slave transfer gate, the first clock signal being supplied from the slave transfer gate to the master transfer gate by at least one clock signal path that does not include active circuit elements, the at least one clock signal path delaying the first clock signal received by the master transfer gate with respect to the first clock signal received by the slave transfer gate.

2. The master-slave flip-flop of claim 1, wherein:
    the clock supply circuit includes
        a first inverter that receives an input clock signal and provides the first clock signal,
        a second inverter that receives the first clock signal and provides a second clock signal, and
        the at least one clock signal path includes at least two clock signal paths that do not include active circuit elements, and the first and second clock signals are supplied from the slave transfer gate to the master transfer gate by the at least two clock signal paths, the at least two clock signal paths delaying the first and second clock signals received by the master transfer gate with respect to the first and second clock signals received by the slave transfer gate.

3. The master-slave flip-flop of claim 1, wherein:
    the clock supply circuit includes
        an inverter circuit that receives the first clock signal and provides a second clock signal, and
        the at least one clock signal path includes at least two clock signal paths that do not include active circuit elements, the first and second clock signals being supplied to the master transfer gate from the slave transfer gate by the at least two clock signal paths, the at least two clock signal paths delaying the first and second clock signals received by the master transfer gate with respect to the first and second clock signals received by the slave transfer gate.

4. The master-slave flip-flop of claim 1, wherein:
    the master transfer gate includes a first insulated gate field effect transistor (IGFET) of a first conductivity type and a second IGFET of a second conductivity type, the first and second IGFETs having source-drain paths arranged in parallel, the gate of the first IGFET receiving the first clock signal, the gate of the second IGFET receiving a second clock signal that is the inverse of the first clock signal.

5. The master-slave flip-flop of claim 1, wherein:
    the slave transfer gate includes a third insulated gate field effect transistor (IGFET) of a first conductivity type and a fourth IGFET of a second conductivity type, the third and fourth IGFETs having source-drain paths arranged in parallel, the gate of the third IGFET receiving the first clock signals the gate of the fourth IGFET receiving a second clock signal that is the inverse of the first clock signal.

6. A circuit, comprising:
    a clock generating circuit that provides at least one first clock signal;
    a slave transfer gate that provides a signal path according to the at least one first clock signal received by at least one slave transfer gate control terminal;
    a slave latch portion that provides a latch output value;
    a master transfer gate that provides a signal path according to at least one second clock signal received by at least one master transfer gate control terminal, the at least one second clock signal being delayed with respect to the at least one first clock signal by at least one clock line having a signal delay path resistance consisting of non-active circuit elements that delays the second clock signal; and
    a master latch portion that provides a master latch value, the master latch portion having an input coupled to the master transfer gate and an output coupled to the slave transfer gate.

7. The circuit of claim 6, wherein:
    the clock generating circuit includes a first inverter that receives an input clock signal and provides an inverted clock signal; wherein
    the at least one first clock signal includes the input clock signal and the inverted clock signal.

8. The circuit of claim 7, wherein:
    the at least one slave transfer gate control terminal includes complementary slave transfer gate control terminals that receive the at least one first clock signal.

9. The circuit of claim 7, wherein:
    the at least one master transfer gate control terminal includes complementary master transfer gate control terminals that receive the at least one second clock signal.

10. The circuit of claim 6, wherein:
    the clock generating circuit includes
        a first inverter that receives an input clock signal and provides an inverted clock signal, and
        a second inverter that receives the inverted clock signal and provides a non-inverted clock signal; wherein
    the at least one first clock signal includes the inverted clock signal and the non-inverted clock signal.

11. The circuit of claim 10, wherein:
    the at least one slave transfer gate control terminal includes complementary slave transfer gate control terminals that receive the at least one first clock signal.

12. The circuit of claim 10, wherein:
    the at least one master transfer gate control terminal includes complementary master transfer gate control terminals that receive the at least one second clock signal.

13. The circuit of claim 6, wherein:

the signal delay path resistance is a parasitic resistance.

14. A master-slave flip-flop (MS-FF) circuit, comprising:

a latch data input;

a master latch portion for storing a data value;

a master transfer gate that couples the latch data input to the master latch portion when enabled and isolates the latch data input from the master latch portion when disabled, the master transfer gate being enabled and disabled according to a delayed clock signal;

a slave latch portion that provides a slave latch value;

a slave transfer gate that couples the master latch portion to the slave latch portion when enabled and isolates the slave latch portion from the master latch portion when disabled, the slave transfer gate being enabled and disabled according to a clock signal;

a clock generating circuit that generates the clock signal; and at least one clock line that receives the clock signal and generates the delayed clock signal with a clock line resistance formed with only non-active circuit elements.

15. The MS-FF circuit of claim 14, wherein:

the clock line resistance is a parasitic resistance formed from a conductive line in an integrated circuit.

16. The MS-FF circuit of claim 14, wherein:

the master transfer gate includes a first field effect transistor (FET) of a first conductivity type and a second FET of a second conductivity type having source-drain paths arranged in parallel with one another, a gate of the first FET receiving the delayed clock signal, and a gate of the second FET receiving a delayed inverted clock signal; and the at least one clock line further includes an inverted clock line that receives an inverted clock signal and generates the delayed inverted clock signal with an inverted clock line resistance formed with only non-active circuit elements.

17. The MS-FF circuit of claim 16, wherein:

the clock generating circuit includes an inverter that receives the clock signal and provides the inverted clock signal.

18. The MS-FF circuit of claim 16, wherein:

the clock generating circuit includes a first inverter that receives an input clock signal and provides the inverted clock signal and a second inverter that receives the inverted clock signal and provides the clock signal.

19. The MS-FF circuit of claim 16, wherein:

the clock line and inverted clock line have generally equivalent lengths.

20. The MS-FF circuit of claim 14, wherein:

the slave transfer gate includes a third FET of the first conductivity type and a fourth FET of a second conductivity type having source-drain paths arranged in parallel with one another, a gate of the third FET receiving the clock signal, a gate of the fourth FET receiving an inverted clock signal.

* * * * *